(12) United States Patent
Hebert

(10) Patent No.: US 8,378,718 B2
(45) Date of Patent: Feb. 19, 2013

(54) DYNAMIC SWITCH DRIVER FOR LOW-DISTORTION PROGRAMMABLE-GAIN AMPLIFIER

(75) Inventor: Gary Hebert, Shrewsbury, MA (US)

(73) Assignee: THAT Corporation, Milford, MA (US)

(*) Notice: Subject to any disclaimer, the term of this patent is extended or adjusted under 35 U.S.C. 154(b) by 0 days.

(21) Appl. No.: 12/857,074

(22) Filed: Aug. 16, 2010

(65) Prior Publication Data

US 2011/0068833 A1 Mar. 24, 2011

Related U.S. Application Data

(60) Provisional application No. 61/234,039, filed on Aug. 14, 2009, provisional application No. 61/234,031, filed on Aug. 14, 2009.

(51) Int. Cl.
*H03B 1/00* (2006.01)
*H03K 3/00* (2006.01)

(52) U.S. Cl. .......... 327/109; 327/427; 327/434; 326/68; 326/81; 326/83

(58) Field of Classification Search .................. 327/109, 327/427, 434; 326/68, 81, 83
See application file for complete search history.

(56) References Cited

U.S. PATENT DOCUMENTS

| 5,201,009 A | 4/1993 | Yamada |
| 6,271,699 B1* | 8/2001 | Dowlatabadi ................. 327/170 |
| 2004/0119522 A1 | 6/2004 | Tachibana |

OTHER PUBLICATIONS

International Search Report and the Written Opinion dated Oct. 27, 2010 from corresponding PCT Application No. PCT/US10/45585.

* cited by examiner

*Primary Examiner* — John Poos
(74) *Attorney, Agent, or Firm* — McDermott Will & Emery LLP

(57) ABSTRACT

A switching circuit for switching a time-varying input signal, the switching circuit comprising: at least one switch including a N-channel MOSFET and a P-channel MOSFET, each having a gate configured to receive a drive signal to change the ON/OFF state of the switch; and a drive circuit configured and arranged so as to selectively apply a pair of drive signals to change the ON/OFF state of the switch, the drive circuit being configured and arranged to generate the drive signals as a function of (a) a pair DC signal components sufficient to change the ON/OFF state of the switch and (b) a pair of time-varying signal components as at least a partial replica of the signal present on the source terminal of each MOSFET so that when applied with the DC signals to the gates of the n-channel MOSFET and p-channel MOSFET respectively, the drive signals will be at the appropriate level to maintain the ON/OFF state of the switch and keep the gate-source voltages of each MOSFET within the gate-source breakdown limit of the MOSFETs.

9 Claims, 10 Drawing Sheets

DYNAMIC SWITCH DRIVER FOR LOW-DISTORTION PROGRAMMABLE-GAIN AMPLIFIER

RELATED APPLICATIONS

The present application is related to and claims priority from U.S. Provisional Patent Application Ser. No. 61/234,039 filed Aug. 14, 2009 in name of Gary K. Hebert and entitled Dynamic Switch Driver for Low-Distortion Programmable-Gain Amplifier, and U.S. Provisional Application Ser. No. 61/234,031 filed Aug. 14, 2009 in the name of Gary K. Hebert and entitled Area Efficient Programmable-Gain Amplifier, both applications being assigned to the present assignee. The present application is also related to and incorporates by reference co-pending application U.S. Ser. No. 12/857,099, filed contemporaneously with the present application in the name of Gary K. Hebert and entitled Area Efficient Programmable-Gain Amplifier and hereinafter being referred to as the "Copending Application"), the latter application also claiming priority from the Provisional Applications and being assigned with this application to a common assignee.

FIELD

The disclosure describes generally a programmable-gain amplifier, and more specifically a low-noise, dynamic switch driver useful in applications including, but not limited to low-distortion programmable-gain amplifiers with discrete controllable gain settings implemented with high-voltage, complementary, metal-oxide semiconductor (CMOS) switches.

BACKGROUND

Low-distortion programmable-gain amplifiers have many applications. For example they are useful in processing analog audio signals where it is important to preserve the integrity of the signals. One prior art implementation of a low-distortion programmable-gain amplifier is shown in FIG. 1. An input signal, which may be AC or DC, is applied to the input $V_{IN}$. The output signal appears at the output $V_{OUT}$. In this embodiment the high-gain operational amplifier $A_1$ is configured as a non-inverting amplifier. This configuration is preferred for low-noise applications over the inverting configuration since the feedback network can be made low impedance to minimize its thermal noise contribution without compromising the amplifier input impedance, which may be set independently via resistor $R_{IN}$. The feedback network around operational amplifier $A_1$ is tapped at any one of a plurality of points by selectively controlling the corresponding electronic switch elements $S_1$ through $S_N$. These switch elements are typically each constructed of complementary metal-oxide semiconductor (CMOS) devices. Control signals ($C_1$ through $C_N$) select the desired gain by turning on the associated switch. Such an approach has the benefit that the variations in ON-resistance of electronic switches $S_1$ through $S_N$ due to changes in input voltage do not affect the linearity of the output signal since no signal current flows through these switches. This minimizes distortion, so long as one and only one of electronic switches $S_1$ through $S_N$ is turned on at any one moment in time.

However, the ON-resistance of each of these switches does contribute thermal noise to the total input noise of the amplifier. One way to decrease the ON-resistance of CMOS electronic switches (and thus to reduce the amplifier's input noise) is to increase the physical width of the CMOS devices which make up the switches. In an integrated circuit, however, an increase in the width of a switch results in an increased die area. Since the approach illustrated in FIG. 1 requires one switch for each desired gain setting, the necessary area taken by the switches in an integrated circuit can be a significant issue.

Another aspect of CMOS electronic switches is that modern CMOS processes often do not allow large voltages to be applied between the gate and channel (source and drain) of the switches, even for so-called "high-voltage" CMOS processes. This can limit the analog voltages which may be switched by CMOS electronic switches, thus restricting the maximum analog voltages, Vin, which can be applied at input of the switch.

Accordingly, it is desirable to provide a dynamic switch driver for a low-distortion programmable-gain amplifier that overcomes or at least substantially reduces the foregoing disadvantages.

SUMMARY

In accordance with one aspect of the invention, a switching circuit for switching a time varying input signal is provided. The switching circuit comprises: at least one switch including a N-channel MOSFET and a P-channel MOSFET, each having a gate configured to receive a drive signal to change the ON/OFF state of the switch; and a drive circuit configured and arranged so as to selectively apply a pair of drive signals to change the ON/OFF state of the switch, the drive circuit being configured and arranged to generate the drive signals as a function of (a) a pair DC signal components sufficient to change the ON/OFF state of the switch and (b) a pair of varying signal components as at least a partial replica of the signal present on the source terminal of each MOSFET so that when applied with the DC signals to the gates of the n-channel MOSFET and p-channel MOSFET respectively, the drive signals will be at the appropriate level to maintain the ON/OFF state of the switch and keep the gate-source voltages of each MOSFET within the gate-source breakdown limit of the MOSFETs.

In accordance with another aspect of the invention, a method of switching a time varying input signal uses at least one switch including a N-channel MOSFET and a P-channel MOSFET, each having a gate configured to receive a drive signal to change the ON/OFF state of the switch. The method comprises: selectively applying a pair of drive signals to change the ON/OFF state of the switch by generating the drive signals as a function of (a) a pair DC signal components sufficient to change the ON/OFF state of the switch and (b) a pair of varying signal components as at least a partial replica of the signal present on the source terminal of each MOSFET so that when applied with the DC signals to the gates of the n-channel MOSFET and p-channel MOSFET respectively, the drive signals will be at the appropriate level to maintain the ON/OFF state of the switch and keep the gate-source voltages of each MOSFET within the gate-source breakdown limit of the MOSFETs.

Although reference is made herein to switching "AC signals", it should be understood that the term "AC signals" is not intended to be limited to signals that return to ground (with no DC component), but also include any time varying signals whose amplitude varies over time, and can include DC signals of either polarity, and signals whose amplitude can include DC components so as to include both polarities over time.

BRIEF DESCRIPTION OF THE DRAWINGS

Reference is made to the attached drawings, wherein elements having the same reference character designations represent like elements throughout, and wherein.

DETAILED DESCRIPTION OF THE DRAWINGS

Figure 1:
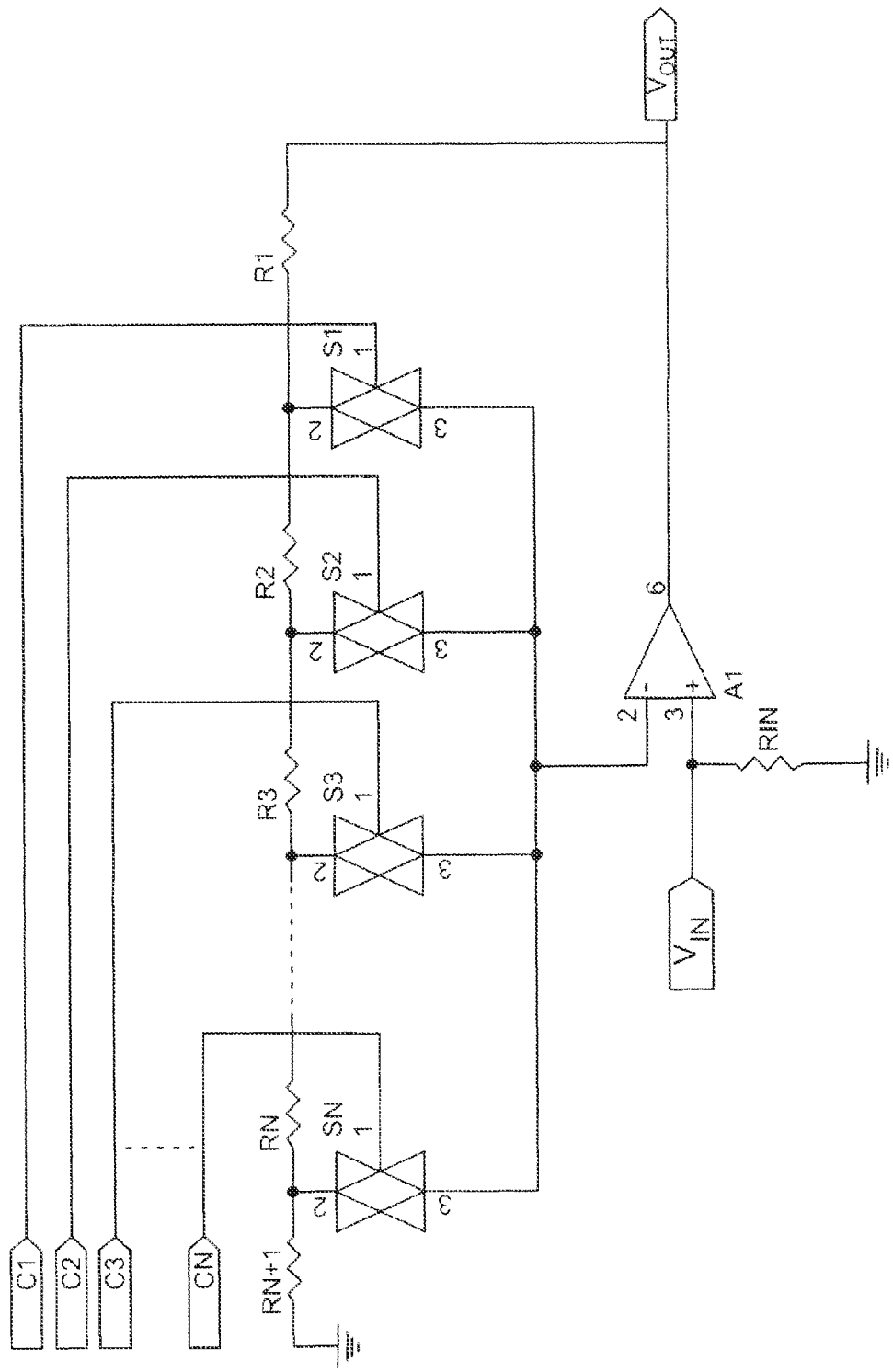
FIG. 1 is a partial schematic, partial block diagram of a prior art implementation of a low-distortion, programmable-gain amplifier.
Figure 2:
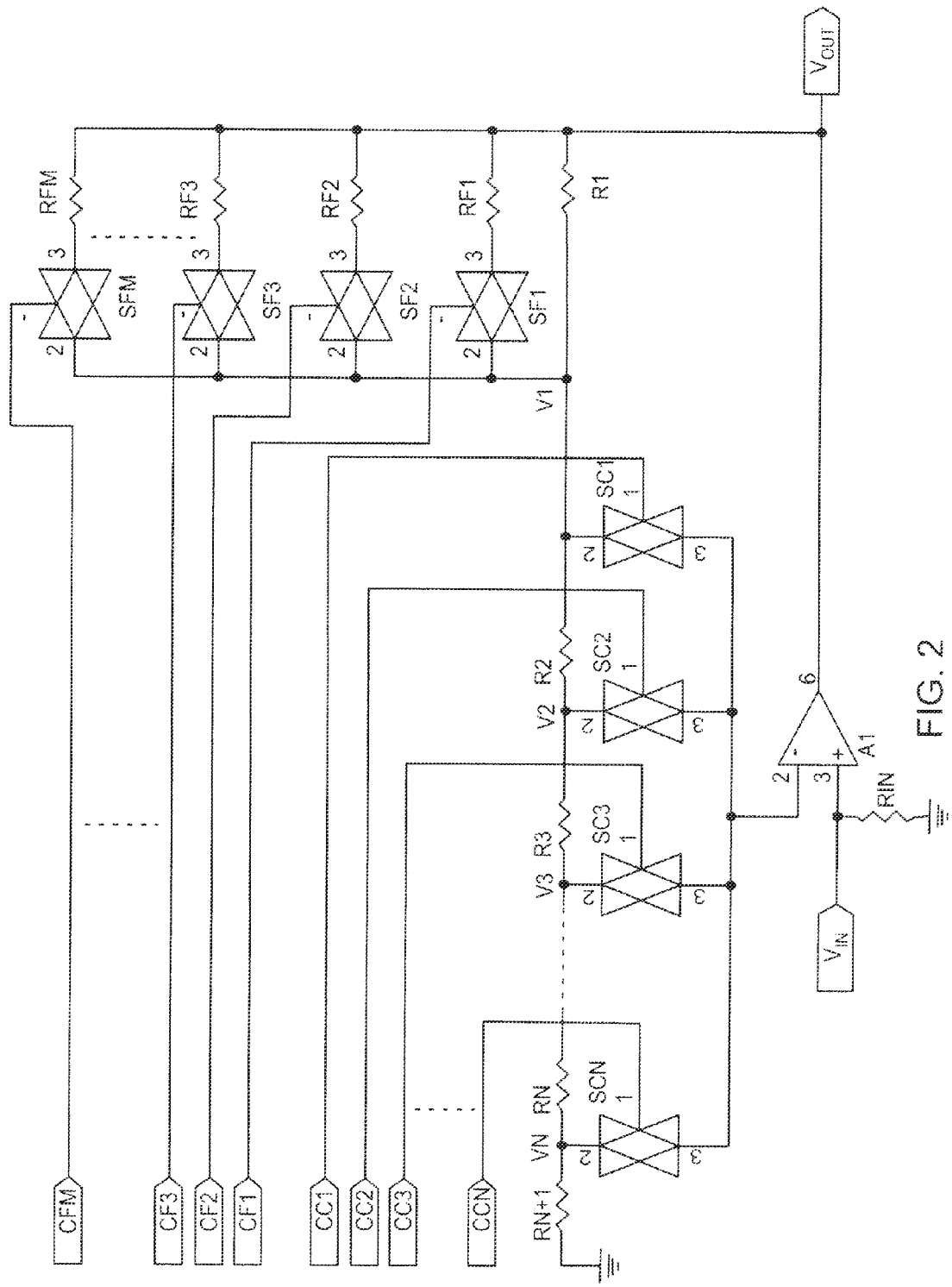
FIG. 2 is a partial schematic, partial block diagram of one embodiment of a more area-efficient, single-ended amplifier constructed in accordance with the teachings described in the Copending Application and further described herein.

In the drawings, FIG. 2 is a schematic representation of an embodiment of a more area-efficient programmable-gain amplifier, described in the Copending Application. High-gain operational amplifier $A_1$ is configured as a non-inverting amplifier, with the input voltage $V_{IN}$ being applied to the non-inverting input of the amplifier. Resistor $R_{IN}$ substantially sets the amplifier input impedance. Resistors $R_1$ through $R_{N+1}$ are connected in series between the output of the amplifier $A_1$ and system ground or a reference node, and comprise a tapped resistor string that provides feedback via a series of discrete voltage dividers selected via electronic switches $S_1$ though $S_N$. Control signals $C_{C1}$ through $C_{CN}$ are used to select one of a series of individual closed-loop gain settings by turning on a corresponding one of the electronic switches $S_1$ through $S_N$ so as to connect a single point along the tapped resistor string to the inverting input of amplifier A1. In addition, one or more of the resistors $R_{F1}$ through $R_{FM}$ modify the closed-loop gain when they are connected in parallel with resistor $R_1$ via electronic switches $S_{F1}$ through $S_{FM}$. Control signals $C_{F1}$ through $C_{FM}$ determine the state of switches $S_{F1}$ through $S_{FM}$ respectively, selectively turning one or more of them on so as to connect those resistors $R_{F1}$ through $R_{FM}$ (for which the corresponding switches $S_F$ have been turned on) in parallel with resistor $R_1$.

Figure 3:
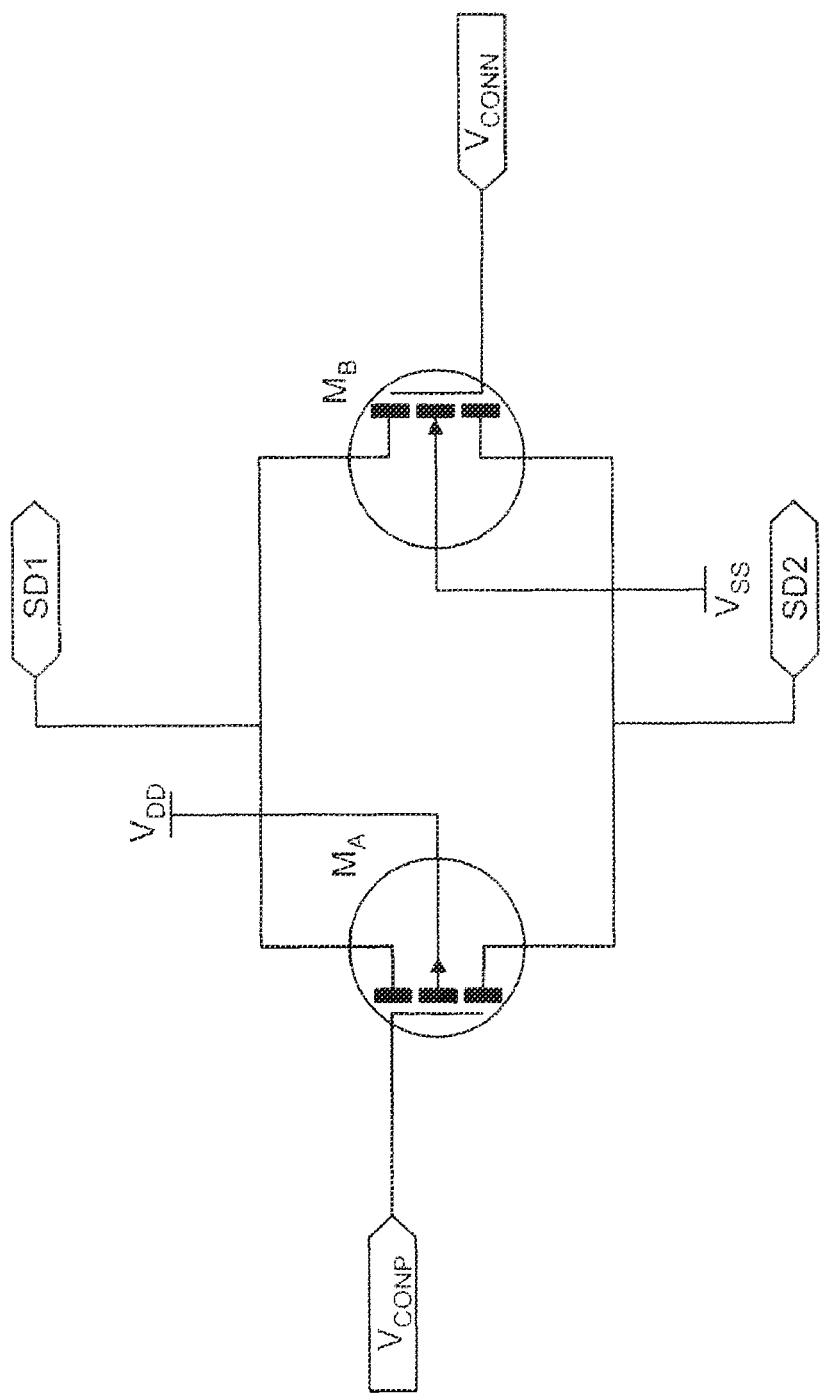
FIG. 3 is a partial schematic, partial block diagram of a CMOS transmission gate that can be used as each of the switches shown in the FIG. 2 embodiment.

Electronic switches $S_1$ through $S_N$ and $S_{F1}$ and $S_{FM}$ each include a CMOS transmission gate. Such transmission gates comprise an N-channel MOS transistor and a P-channel MOS transistor in parallel, as illustrated in FIG. 3. One source-drain terminal of P-channel MOSFET $M_A$ is connected to one source-drain terminal of N-channel MOSFET $M_B$. The remaining source-drain terminals of $M_A$ and $M_B$ are also connected together. In operation, the body connection of P-channel MOSFET $M_A$ is connected to a voltage Vdd more positive than the maximum expected voltage on either of its source-drain terminals. The body connection of N-channel MOSFET $M_B$ is connected to a voltage Vss more negative than the maximum expected voltage on either of its source-drain terminals. These are often the positive and negative power supply voltages used with the integrated circuit containing one or more of these switches.

Control of the state of each transmission gate is accomplished via the gate terminals of the two MOSFETS, $M_A$ and $M_B$. More specifically, when the gate of P-channel MOSFET $M_A$ is made sufficiently negative with respect to its source-drain terminals, and the gate of N-channel MOSFET $M_B$ is made sufficiently positive with respect to its source-drain terminals, both devices are considered to be operating in the triode region, and are characterized by a relatively low resistance between the two source-drain terminals $SD_1$ and $SD_2$. This resistance between the source-drain terminals of each device is often referred to as the ON-resistance (thereby defining the ON-state of the device), and can be approximately characterized by the following equation:

$$r_{dson} = \frac{1}{\mu C_{OX}\left(\frac{W}{L}\right)(V_{GS} - V_t)} = \frac{1}{\mu C_{OX}\left(\frac{W}{L}\right)(V_{eff})} \quad (1)$$

wherein $\mu$ is the mobility of the carriers in the channel,
$C_{OX}$ is the gate capacitance per unit area,
W and L are the channel width and length, respectively,
$V_{GS}$ is the gate-source voltage, and
$V_t$ is the threshold voltage (the threshold voltage is that gate-source voltage above which a channel is present); and
$V_{eff}$ is the effective gate-source voltage, $V_{GS}$-$V_t$.

From equation (1), it is clear that reducing ON-resistance requires some combination of increased carrier mobility, increased gate capacitance per unit area, increased gate width, reduced gate length, and/or increased effective gate-source voltage. Carrier mobility may be adjusted over a limited range (approximately 20:1 for electrons and 10:1 for holes at room temperature) by adjusting the doping concentration in the source and drain regions. However, increasing doping concentrations in the source and drain reduces breakdown voltage, which reduces the signal voltages that can be applied when the switch is in the OFF-state. Increasing gate capacitance per unit area requires thinner gate oxide. Reducing the gate-oxide thickness reduces the gate-source breakdown voltage, and, thus can compromise the transmission gate's ability to handle large signal voltages. As many applications for MOS switches involve DC, rather than AC, signals, high-voltage CMOS processes often trade the lower gate-source breakdown voltage that results from thinner gate oxide for the lower ON-resistance that this brings. The resulting devices exhibit lower gate-source breakdown voltages than drain-source breakdown voltages. For applications where the source stays at a fixed voltage, and the switched load is in series with the drain, the gate-source voltage can easily be limited to the $V_{eff}$ required to reach the minimum ON-resistance for the device where it is no longer governed by equation (1), but is limited by other ohmic resistances. The improvements described herein allow the use of such devices for switching varying voltages that exceed the gate-source breakdown voltage.

Referring again to FIG. 2, gain-control switches $S_{F1}$ through $S_{FM}$ (hereafter referred to as the "$S_{Fi}$" switches) will be exposed to signal voltages on the terminals labeled 2 and 3 corresponding to the source-drain terminals of the CMOS switch of the type shown in FIG. 3. When any of these switches is in the OFF-state, one side of the switch, labeled as terminal 3 in FIG. 2, will be at the same voltage as the output voltage, $V_{OUT}$, of amplifier $A_1$. The other side of the switch, labeled as terminal 2 in FIG. 2, will be at a voltage equal to a fraction of $V_{OUT}$ determined by the settings of the other $S_{Fi}$ switches and by the voltage division provided by the string of resistors $R_1$ through $R_{N+1}$. This voltage is labeled $V_1$ in FIG. 2.

By definition, the source terminal for the N-channel MOSFET in the CMOS switch in FIG. 3 is the terminal at the more negative potential, while the drain terminal of the N-channel MOSFET is the terminal at the more positive potential. In order to keep the N-channel MOSFET in the OFF-state, the gate voltage must be less than or equal to the source voltage. Similarly, the source terminal for the P-channel MOSFET in FIG. 3 is defined as the more positive of the two source-drain terminals, while the drain terminal of the P-channel MOSFET is the more negative of the two. To keep the P-channel MOSFET in the OFF-state, the gate terminal voltage on the P-channel MOSFET must be greater than or equal to the source voltage.

If the switch is fabricated in a process in which the gate-source breakdown voltage is equal to or greater than the source-drain voltage, common practice to turn the CMOS switch off is to connect the N-channel MOSFET gate to the most negative power supply voltage applied to the integrated circuit, and the P-channel MOSFET gate to the most positive power supply voltage applied to the integrated circuit in order to ensure that both MOSFETs stay OFF for any possible signal voltage within range of the power supplies.

However, for high-voltage CMOS processes as described above, in which the gate-source breakdown voltage is substantially less than the source-drain breakdown voltage, this practice could lead to breakdown of the gate oxide and damage to the device. In an example of one embodiment, the CMOS switch is fabricated in a high-voltage CMOS process in which the source-drain breakdown voltage of each of the N-channel and P-channel devices exceeds 40V, but the gate-source breakdown voltage for each of the devices is 20V. The typical power supply voltages utilized in the example are +15V and −15V. The signal voltages at $V_{IN}$ and $V_{OUT}$ can be anywhere within the range defined by these voltages. If, for example, the gate of the N-channel MOSFET were connected to −15V to turn it OFF, a voltage greater than +5V at $V_1$ would cause the gate-source voltage to exceed the N-channel MOSFET' s maximum gate-source voltage rating. Similarly, a voltage at $V_1$ less the −5V would cause the gate-source voltage of the P-channel MOSFET to exceed its maximum rating.

Figure 4:
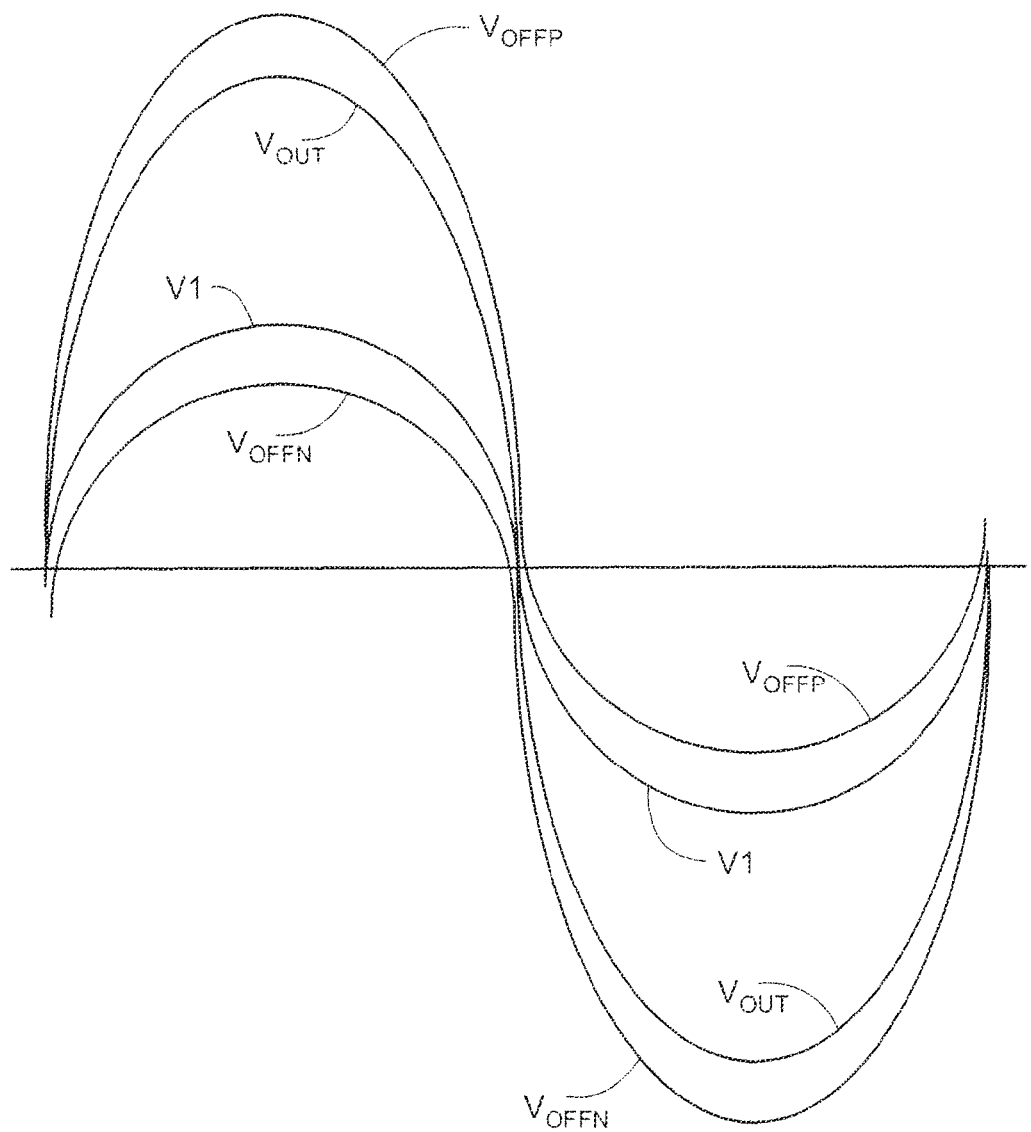
FIG. 4 is an amplitude-time graphical illustration of exemplary OFF-voltage waveforms for switch gates $s_{f1} \sim s_{fn}$ shown in FIG. 2.

In order to keep both MOSFETS in the OFF-state, but at the same time not violate the maximum gate source voltage, a gate-drive circuit can be used to maintain the N-channel MOSFET gate voltage at or slightly below the source voltage at all times. The source voltage for the N-channel MOSFET in the $SF_i$ switches in FIG. 2 will be the lesser of $V_1$ and $V_{OUT}$. The source voltage for the P-channel MOSFET in the $SF_i$ switches in FIG. 2 will be the greater of $V_1$ and $V_{OUT}$. Accordingly, the gate voltages of the N-channel MOSFETs are driven in the OFF-state with a voltage slightly below the lesser of $V_1$ and $V_{OUT}$, and the gates of the P-channel MOSFETs with a voltage slightly above the greater of $V_1$ and $V_{OUT}$, as illustrated in FIG. 4. In FIG. 4, $V_{OFFN}$ is thus a gate voltage capable of maintaining the N-channel MOSFET in the OFF-state, and $V_{OFFP}$ is the preferred gate voltage capable of maintaining the P-channel MOSFET in the OFF-state.

Referring again to FIG. 2, whenever any of the $S_{Fi}$ switches are turned on, the source and drain voltages of both MOSFETs for that switch will be at approximately $V_1$. In order to maintain both MOSFETs of that switch in the ON-state, the gate-source voltage of the NMOS device must be kept sufficiently positive to provide the desired ON-resistance, and the gate-source of the PMOS device must be kept sufficiently negative for the same reason. In prior art designs that utilize low power supply voltages, this is typically done by connecting the NMOS gate to a voltage substantially equal to the positive power supply voltage, and the PMOS gate to a voltage substantially equal to the negative supply voltage.

Figure 5:
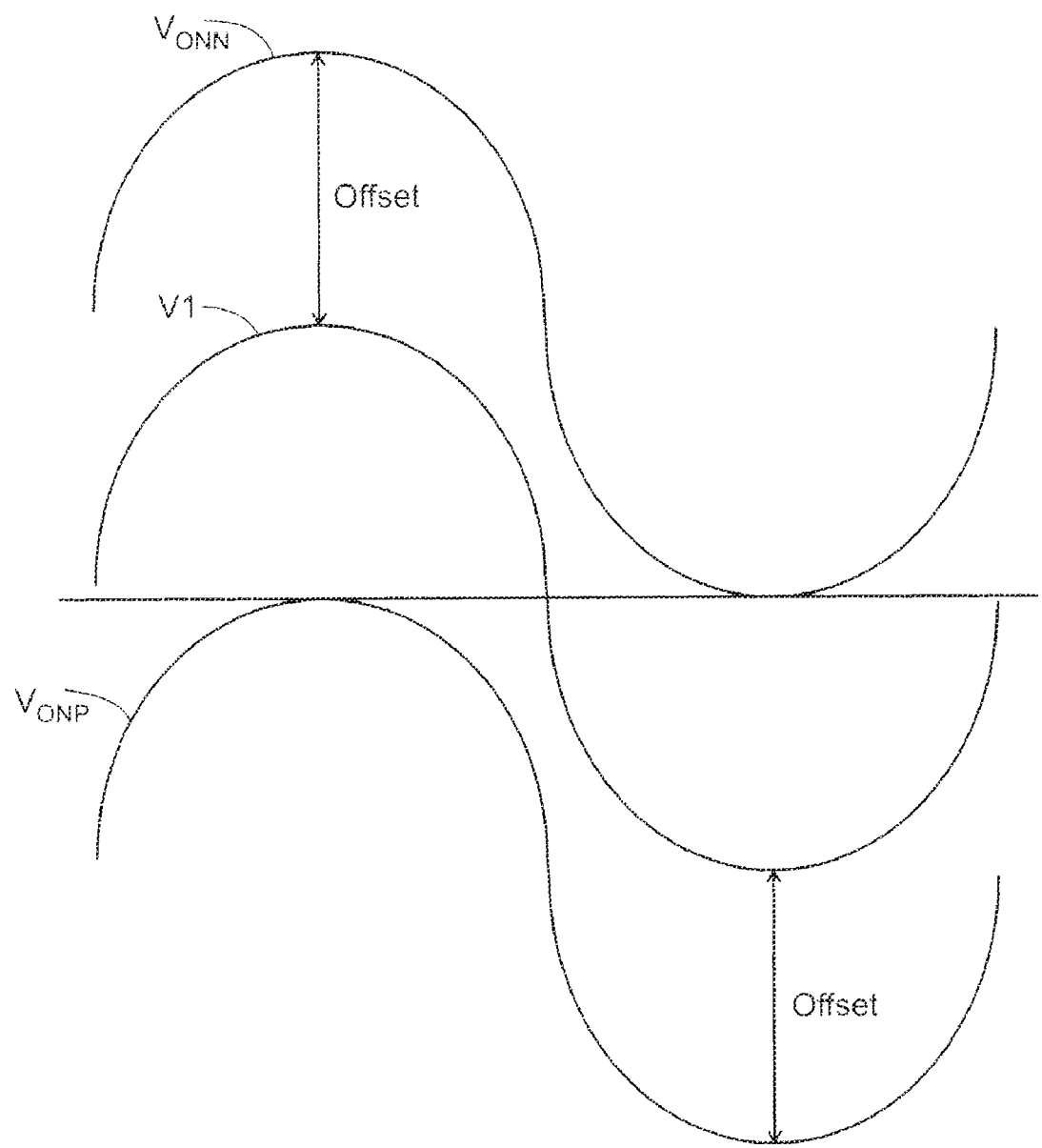
FIG. 5 is an amplitude-time graphical illustration of exemplary ON-voltage waveforms for switch gates $S_{F1}$ through $S_{Fn}$ shown in FIG. 2.

However, in order to accommodate signal voltages that exceed the gate-source breakdown voltage, a simple connection to a voltage substantially equal to the positive or negative supply voltages is not possible. In order to prevent breakdown of the gate oxide, the NMOS device gate-source voltage is preferably kept equal to $V_1$ plus a sufficient positive offset to ensure low ON-resistance. Likewise, the PMOS device gate-source voltage is preferably kept equal to $V_1$ plus a sufficient negative offset to ensure low ON-resistance. This is illustrated in FIG. 5, which shows an example of a signal voltage $V_1$, and a gate voltage $V_{ONN}$ applied to maintain the NMOS device in the ON-state, and a gate voltage $V_{ONP}$ applied to maintain the PMOS device in the ON-state. Since the gate-source voltage of each device is kept substantially constant with changes in signal voltage, any distortion contribution due to variation in switch ON-resistance with signal voltage is minimized. In an example of one embodiment, the offset voltage between $V_1$ and $V_{ONN}$ is approximately +9V, and the offset voltage between $V_1$ and $V_{ONP}$ is approximately −9V.

Gain-control switches $S_1$ through $S_N$ in FIG. 2 require similar protection from damaging gate-source voltages. As described in the Copending Application, switches $S_1$ through $S_N$ are utilized by turning only one of these switches on at a time, which minimizes any distortion contribution from the switch due to variations in ON-resistance with signal voltage. Thus, the switch that is turned on will have input signal voltage $V_{IN}$ on the source and drain of both MOSFETs, as long as amplifier $A_1$ is operating in its linear region. The rest of the gain-control switches $S_1$ through $S_N$ will see this same voltage on the terminals 3 in FIG. 2. The terminals of these switches labeled 2 in FIG. 2 will be at a voltage equal to a fraction of $V_{OUT}$ determined by the settings of the $S_{Fi}$ switches and by the voltage division provided by the string of resistors $R_1$ through $R_{N+1}$. These voltages are labeled as $V_1$ through $V_N$ in FIG. 2.

Figure 6:
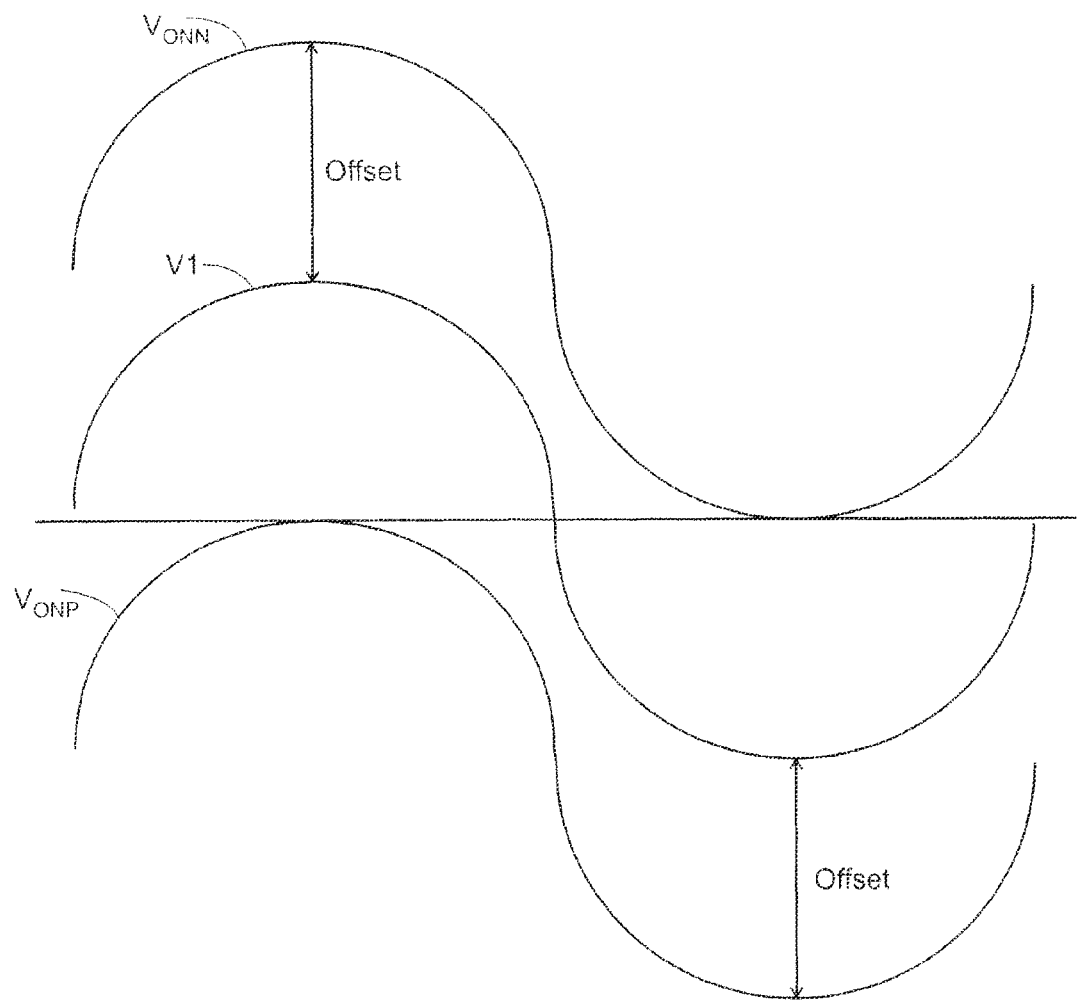
FIG. 6 is an amplitude-time graphical illustration of exemplary ON-voltage waveforms for switch gates $S_1$ through $S_N$ shown in FIG. 2.

As described above for the switches $S_{F1}$ through $S_{FM}$, in one example the magnitude of the gate-source breakdown voltage of the NMOS and PMOS devices that make up switches $S_1$ through $S_N$ is 20V and the typical power supply voltages for opamp $A_1$ are +15 V and −15 V. If the gate of each of the NMOS devices were tied to +15 V and the gate of each of the PMOS devices were tied to −15 V in order to keep the desired switches $S_1$ through $S_N$ in the ON-state, input signal voltages at terminal $V_{IN}$ in excess of +5 V or −5V would exceed the maximum gate-source voltage on devices in switches. Similarly as with switches $S_{F1}$ through $S_{FM}$, in order to protect against exceeding the maximum gate-source voltage, the NMOS gate-source voltage for switches $S_1$ through $S_N$ is preferably kept equal to the voltage at the inverting input of operational amplifier $A_1$ plus a sufficient positive offset to ensure low ON-resistance. Similarly, the PMOS gate-source voltage for switches $S_1$ through $S_N$ is preferably kept equal to the voltage at the inverting input of operational amplifier $A_1$ plus a sufficient negative offset to ensure low ON-resistance. This is illustrated in FIG. 6, which shows an example of an operational amplifier $A_1$ inverting input voltage, $V_{IN-}$, and a preferred gate voltage $V_{ONN}$ to maintain the NMOS device in the ON-state, and a preferred gate voltage $V_{ONP}$ to maintain the PMOS device in the ON-state. In one example of the illustrated embodiment, the offset voltage between $V_{IN-}$ and $V_{ONN}$ is approximately +9V, and the offset voltage between $V_{IN-}$ and $V_{ONP}$ is approximately −9V.

The MOSFETs in those switches $S_1$ through $S_N$ that are turned OFF may also potentially be exposed to excessive gate-source voltages if the gates were driven to the power supply voltages to maintain the MOSFETs in the OFF-state. In particular, even at the highest gain settings (typically achieved when switch $S_N$ in FIG. 2 is turned on), switches $S_2$ through $S_N$ can be exposed to large voltage swings on both signal terminals. One way in which this can occur is if operational amplifier $A_1$ is of the type known in the art that includes protection from excessive differential input voltages, such as those including back-to-back diodes across their input terminals. In such case, the inverting and non-inverting inputs of operational amplifier $A_1$ will never be more than 1 volt apart. Thus, large input voltages at terminal $V_{IN}$ will be largely reflected to the inverting input terminal. At high gain settings, such large input voltages will cause the output of operational amplifier $A_1$ to clip at the maximum possible output voltage, typically within a few volts or less of the supply voltages, while the high input signal level itself causes the large input voltage to appear at terminals 3 of switches $S_1$ through $S_N$. Thus, each of those switches $S_1$ through $S_{N-1}$ may be exposed to signal voltages that approach either of the supply voltages on both signal terminals (2 and 3).

Figure 7:
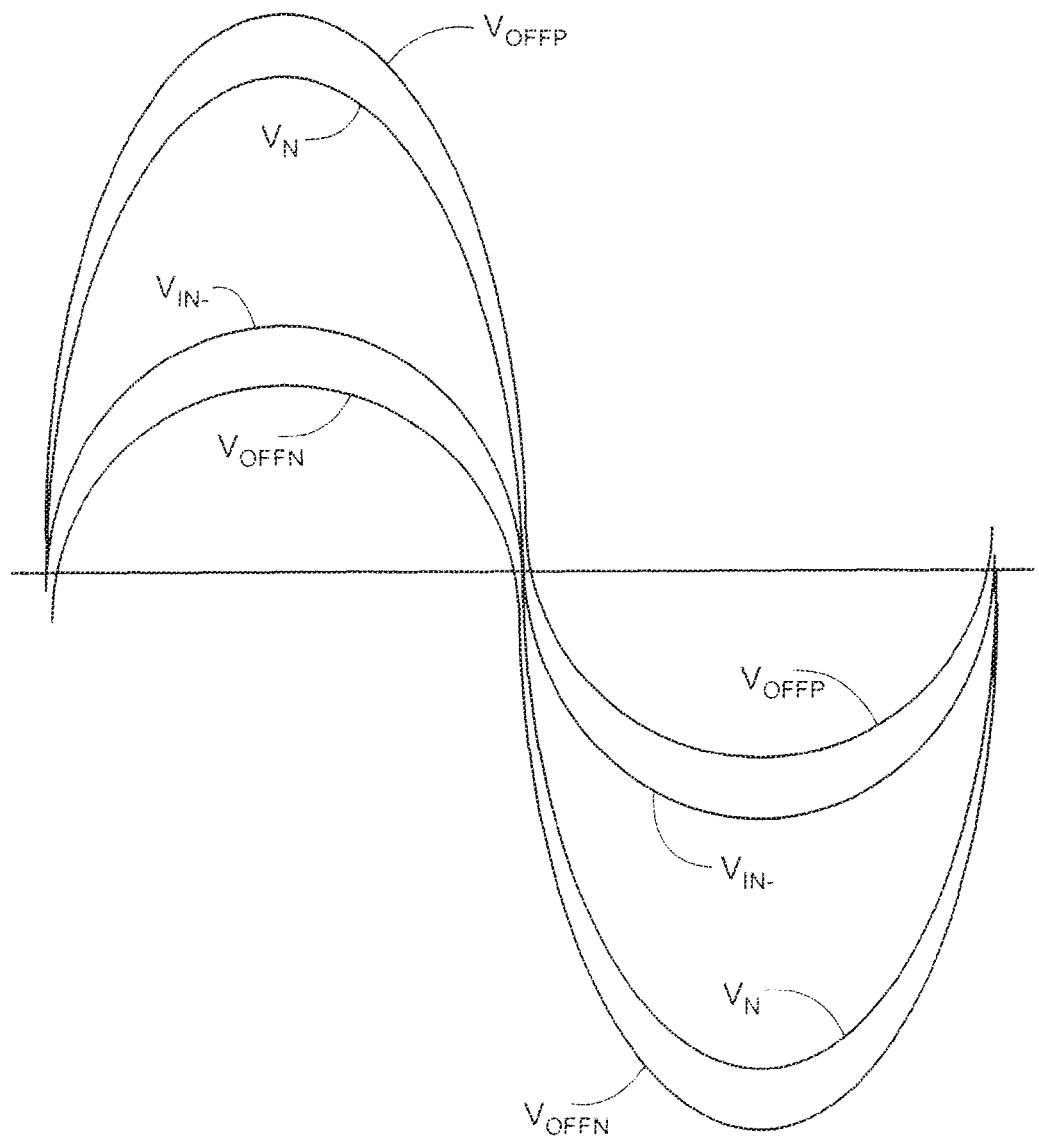
FIG. 7 is an amplitude-time graphical illustration of exemplary OFF-voltage waveforms for switch gates $S_1$ through $S_N$ shown in FIG. 2.

As described above for gain-control switches $S_{F1}$ through $S_{FM}$, the preferred gate voltage for maintaining the N-channel MOSFETs in the OFF-state while not violating the maximum gate-source voltage is a voltage equal to or slightly less than the source voltage. For the N-channel MOSFETs in gain-control switches $S_1$ through $S_N$, the source voltage will be the lesser of the voltage at the inverting input of operational amplifier $A_1$ ($V_{IN-}$) and the voltage ($V_N$ for switch $S_N$) at the other side of the switch. Similarly, the preferred gate voltage for the P-channel MOSFETs in the OFF-state will be equal to or slightly greater than the source voltage, which will be the greater of $V_{IN-}$ or $V_N$ for switch $S_N$. These waveforms are illustrated in FIG. 7.

Figure 8:
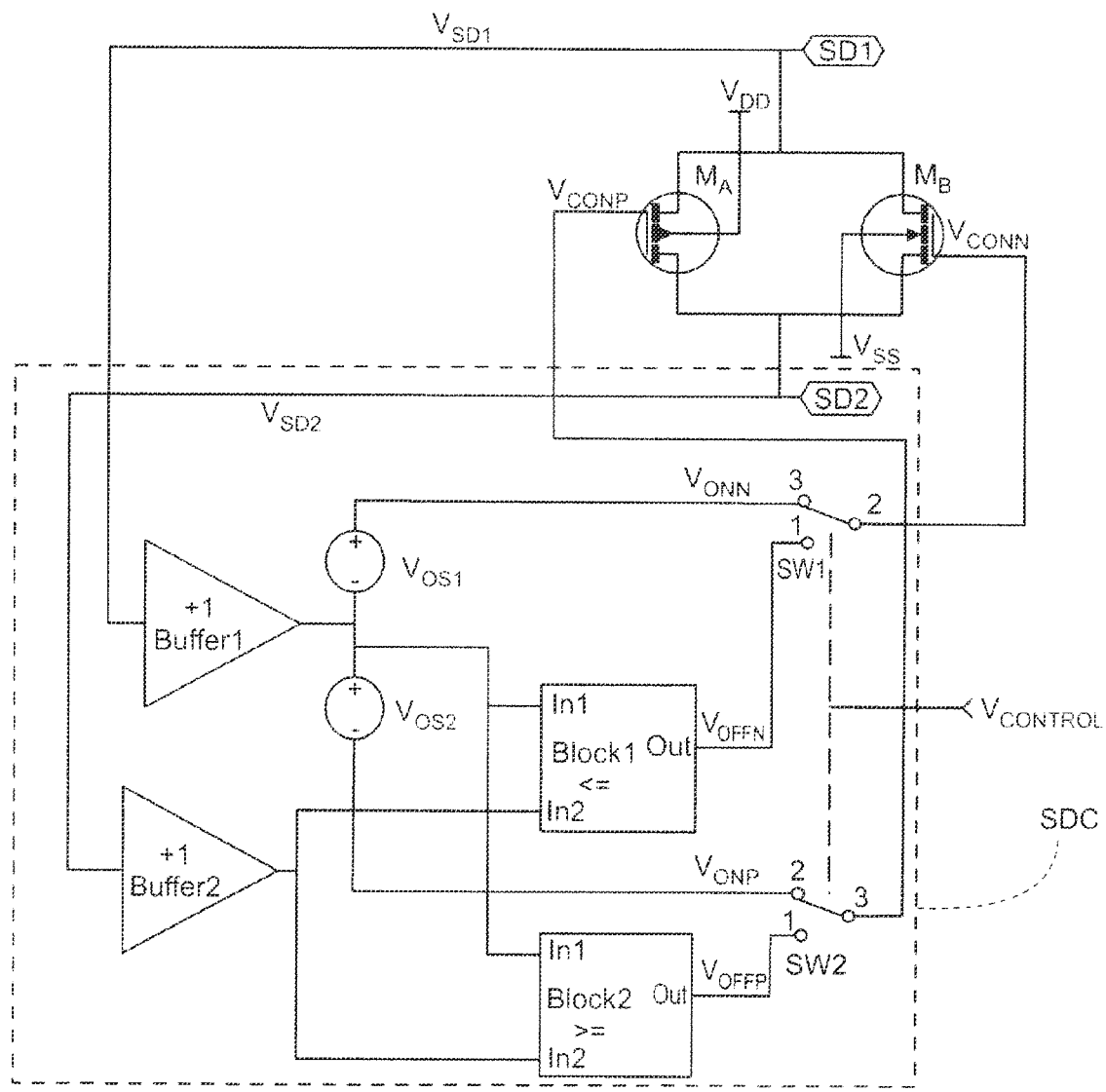
FIG. 8 is a block diagram of one embodiment of a switch driver that can be used to operate the amplifier of the type described in the Copending Application such as the amplifier shown in FIG. 2.

FIG. 8 is a partial schematic and partial block diagram illustrating one embodiment of a circuit for generating gate-control voltages for the transmission-gate of the N-channel and P-channel MOSFETs. Referring to FIG. 8, a CMOS transmission gate includes MOSFETs $M_A$ and $M_B$. Signal voltages $V_{SD1}$ and $V_{SD2}$, appearing at the inputs SD1 and SD2 and applied to the source-drain terminals $SD_1$ and $SD_2$, are also buffered by unity-gain amplifiers, Buffer$_1$ and Buffer$_2$, respectively, to prevent any loading of the gain-control network (an embodiment of which is shown in FIG. 2 as including resistors R1 through RN+1 and R1 through RFM). The output of amplifier Buffer$_1$ is connected to the negative terminal of offset voltage source $V_{OS1}$, the positive terminal of offset voltage source $V_{OS2}$, the first input of "less-than-or-equal-to" Block$_1$ and the first input of "greater-than-or-equal-to" Block$_2$, all of which comprise the switch-driver circuit SDC. Thus, the voltage $V_{ONN}$ at the positive terminal of voltage source $V_{OS1}$ will be equal to the voltage at terminal $SD_1$ plus a positive offset determined by the voltage provided by $V_{OS1}$. If the offset voltage $V_{OS1}$ is chosen appropriately as described above, then voltage $V_{ONN}$ will be a suitable gate voltage to maintain N-channel MOSFET $M_B$ in the ON-state in accordance with the present disclosure. Similarly, the voltage $V_{ONP}$ at the negative terminal of voltage source $V_{OS2}$ will be equal to the voltage at terminal $SD_1$ plus a negative offset determined by the voltage provided by $V_{OS2}$. If the offset voltage $V_{OS2}$ is chosen appropriately as described above, then voltage $V_{ONP}$ will be a suitable gate voltage to maintain P-channel MOSFET $M_A$ in the ON-state.

The output of amplifier Buffer$_2$ is connected to the second input of "less-than-or equal-to" Block$_1$ and the second input of "greater-than-or-equal-to" Block$_2$. The output of Block$_1$, $V_{OFFN}$, will be a voltage equal to the more negative of the two voltages at its inputs, or the voltage at both inputs if the input voltages are equal. The output of Block$_2$, $V_{OFFP}$, will be a voltage equal to the more positive of the two voltages at its inputs, or the voltage at both inputs if the input voltages are equal. Thus, the voltage $V_{OFFN}$ at the output of Block$_1$ will be equal to the more negative of the voltages at switch terminals $SD_1$ and $SD_2$, and will be a suitable gate voltage to maintain N-channel MOSFET $M_B$ in the OFF-state. Similarly, the voltage $V_{OFFP}$ at the output of Block$_2$ will be the more positive of the voltages at switch terminals $SD_1$ and $SD_2$, and will be a suitable gate voltage to maintain P-channel MOSFET $M_A$ in the ON-state.

Switches $SW_1$ and $SW_2$ are representative of electronic switches that are controlled by control signal $V_{CONTROL}$. Control signal $V_{CONTROL}$ preferably has two states; an "ON" state for turning MOSFETs $M_A$ and $M_B$ on, and an "OFF" state for turning MOSFETs $M_A$ and $M_B$ OFF. When control signal $V_{CONTROL}$ is in the "ON" state, terminals 2 and 3 of switch $SW_1$ are connected, and terminals 2 and 3 of switch $SW_2$ are connected, applying the appropriate gate voltages $V_{ONN}$ and $V_{ONP}$ to MOSFETs $M_B$ and $M_A$, respectively, to maintain both MOSFETs in the ON-state. When control signal $V_{CONTROL}$ is in the "OFF" state, terminals 1 and 2 of switch $SW_1$ are connected, and terminals 1 and 2 of switch $SW_2$ are connected, applying the appropriate gate voltages $V_{OFFN}$ and $V_{OFFP}$ to MOSFETs $M_B$ and $M_A$, respectively to maintain both in the OFF-state.

It should be noted that the negative terminal of offset voltage source $V_{OS1}$ and/or the positive terminal of offset voltage source $V_{OS2}$ could be alternatively connected to the output of amplifier Buffer$_2$ instead of the output of amplifier Buffer$_1$ with no loss of functionality, since, when MOSFETs $M_A$ and $M_B$ are on, there is little voltage difference across the terminals $SD_1$ and $SD_2$.

Figure 9:
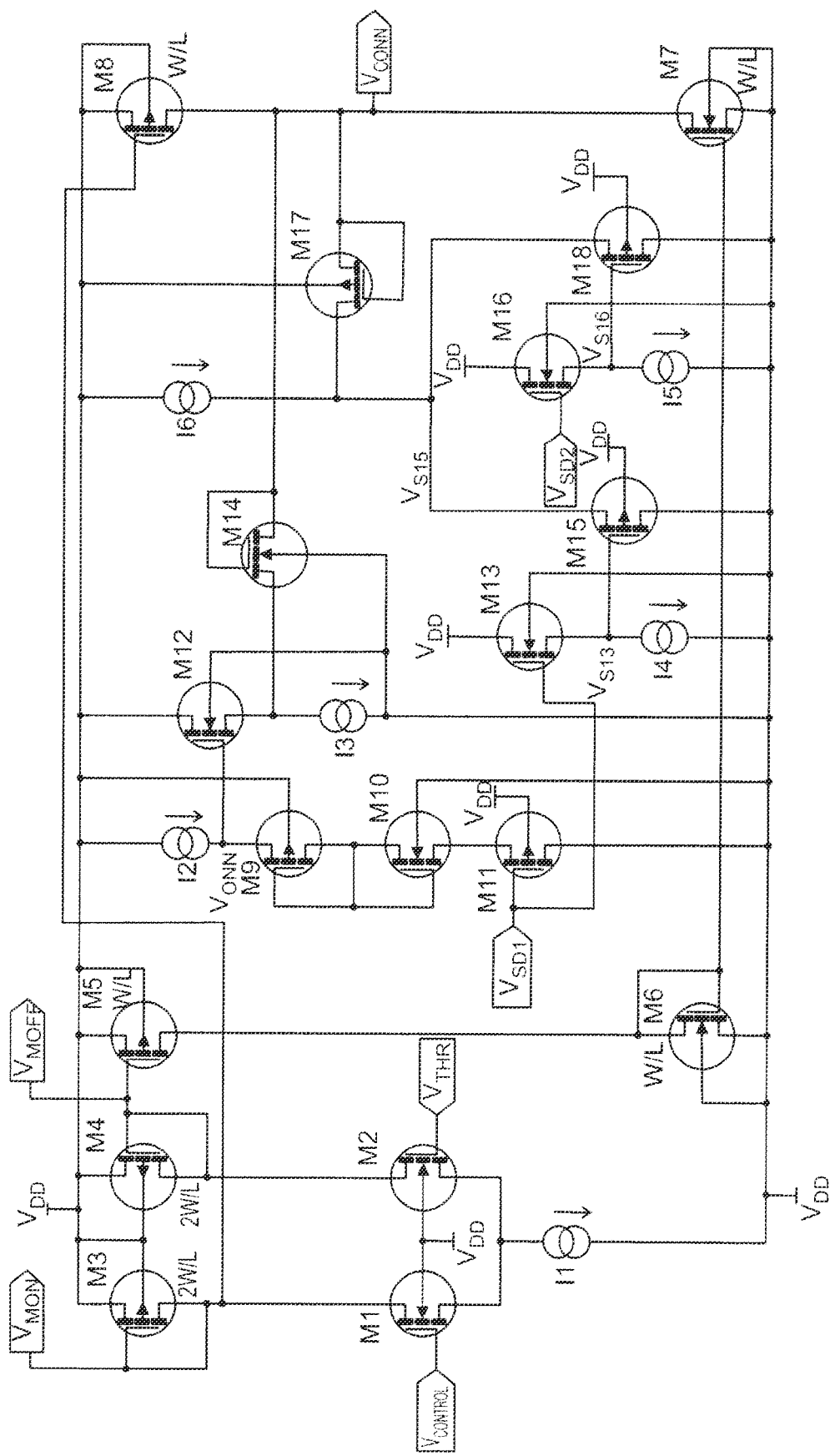
FIG. 9 is a schematic diagram of one embodiment of an N-channel gate drive circuit that can be implemented as a part of the switch driver shown in FIG. 8 for operating the N-channel MOSFET of the CMOS transmission gate shown in FIG. 3.
Figure 10:
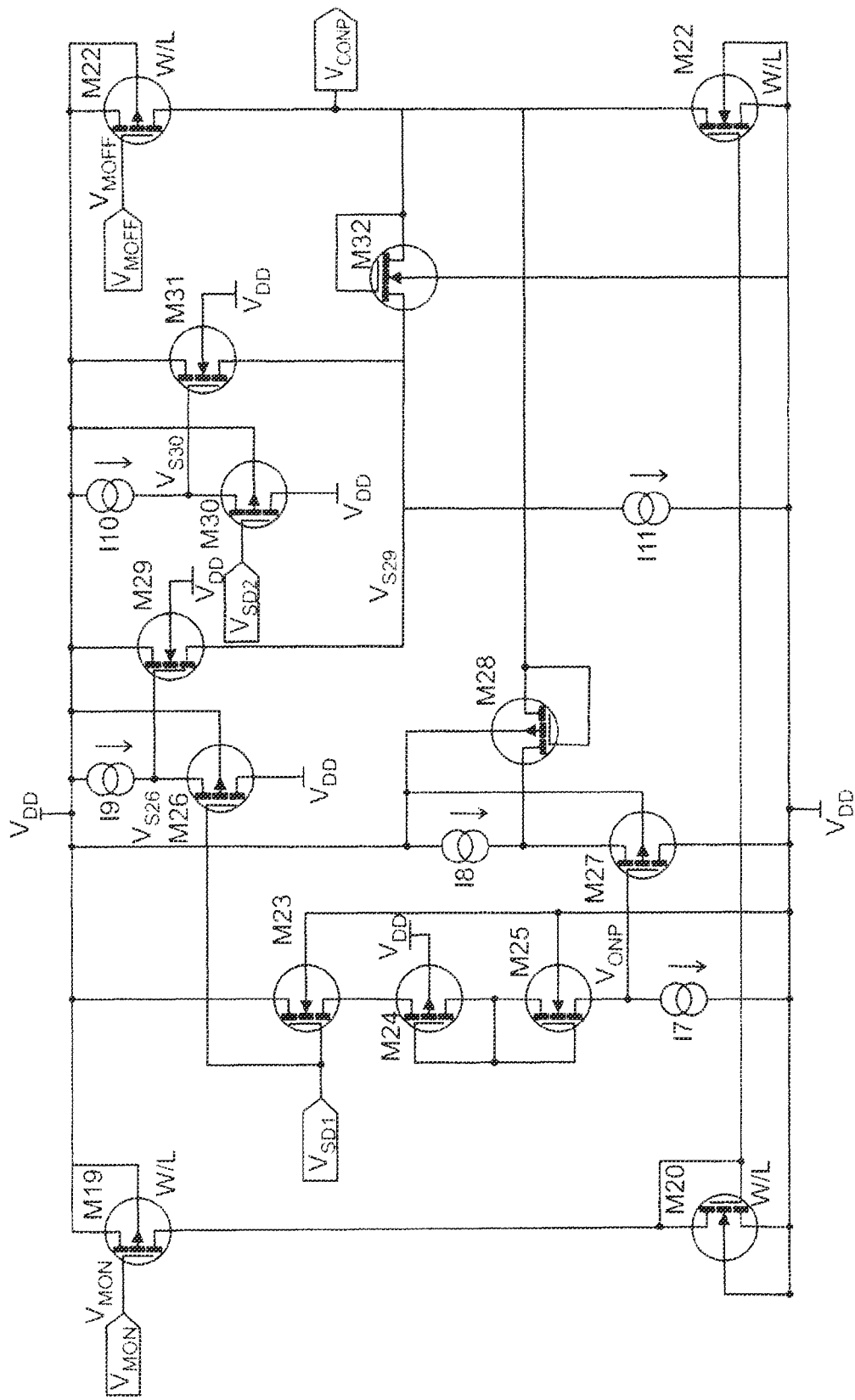
FIG. 10 is a schematic diagram of one embodiment of an P-channel gate drive circuit that can be implemented as a part of the switch driver shown in FIG. 8 for operating the P-channel MOSFET of the CMOS transmission gate shown in FIG. 3.

FIGS. 9 and 10 schematically illustrate in more detail, one embodiment of switch driver circuitry of the type described herein. FIG. 9 shows a schematic diagram of circuitry for interfacing to a control signal, as well as the NMOS gate driver circuitry for the CMOS switch. FIG. 10 shows schematically the PMOS gate driver circuitry for the CMOS switch.

Referring to FIG. 9, N-channel MOSFET differential pair $M_1$ and $M_2$ provides an interface between a control voltage $V_{CONTROL}$ and the gate driver circuitry via terminal $V_{CONTROL}$. Control voltage $V_{CONTROL}$ is preferably a logic signal that is set to one of two levels, a high level greater than threshold voltage $V_{THR}$ or a low level less than threshold voltage $V_{THR}$. When control voltage $V_{CONTROL}$ is set to the high level, N-channel MOSFET $M_1$ is turned on and conducts substantially all of the current from current source $I_1$, and N-channel MOSFET $M_2$ is substantially OFF. When control voltage $V_{CONTROL}$ is set to the low level, N-channel MOSFET $M_2$ conducts substantially all of the current from current source $I_1$, and N-channel MOSFET $M_1$ is substantially in an OFF-state. In this manner, control voltage $V_{CONTROL}$ steers the current from current source $I_1$ to flow through one of either a diode-connected P-channel MOSFET $M_3$ or $M_4$.

Source-drain voltage terminal $V_{SD1}$ is preferably connected to one of the two signal terminals of the CMOS switch to be controlled by the gate driver circuitry, and source-drain voltage terminal $V_{SD2}$ is preferably connected to the other of the two signal terminals of the CMOS switch to be controlled. For example referring to FIG. 3, terminal $V_{SD1}$ would preferably be connected to terminal $SD_2$ of the CMOS switch and $V_{SD2}$ would preferably be connected to terminal $SD_2$ of the CMOS switch. Terminal $V_{CONN}$ is preferably connected to the gate terminal of the N-channel MOSFET in the CMOS switch to be controlled.

Referring again to FIG. 9, P-channel MOSFET $M_{11}$, along with diode-connected P-channel MOSFET $M_9$, diode-connected N-channel MOSFET $M_{10}$, and current source $I_2$ in FIG. 9 form a source-follower buffer for source-drain voltage $V_{SD1}$, such that the voltage $V_{ONN}$ at the source of MOSFET $M_9$ is substantially given by:

$$V_{ONN}=V_{SD1}+V_{SG11}+V_{GS10}+V_{SG9},$$

where $V_{SG11}$, $V_{GS10}$, and $V_{SG9}$ are the gate-source (or source-gate) voltages of $M_{11}$, $M_{10}$, and $M_9$, respectively, and all are positive quantities.

The gate-source voltages are substantially constant with changes in source-drain voltage $V_{SD1}$ to the extent that current source $I_2$ is constant, since the gate of N-channel MOSFET $M_{12}$ provides negligible loading on the source of MOSFET $M_9$. MOSFET $M_{11}$ is preferably of the minimum geometry allowed by the process design rules and voltage requirements in order to minimize the capacitive loading on the voltage $V_{SD1}$. In an example of one embodiment, the value of current source $I_2$ is approximately 10 µA, and the nominal value of the sum of gate-source voltages of MOSFETs $M_9$ though $M_{11}$ is 9V. Thus the voltage $V_{ONN}$ at the source of MOSFET $M_9$ will substantially equal the preferred ON-voltage for the N-channel MOSFET in the CMOS switch to be controlled, as described above.

N-channel MOSFET $M_{12}$ and current source $I_3$ act as a source-follower buffer for voltage $V_{ONN}$ such that the voltage at the source of MOSFET $M_{12}$ is substantially equal to $V_{ONN}$-$V_{GS12}$, where $V_{GS12}$ is the gate-source voltage of MOSFET $M_{12}$. The preferred value for current source $I_3$ is equal to the value of current source $I_1$. When control voltage $V_{CONTROL}$ is high, the current from current source $I_1$ is steered via MOSFETs $M_1$ to $M_3$. Further, since there is substantially no current flowing in MOSFET $M_4$, there is also substantially no current flowing in P-channel MOSFET $M_5$, N-channel MOSFET $M_6$, or N-channel MOSFET $M_7$. The gate and source terminals of MOSFET $M_3$ are connected to the gate and source terminals, respectively, of P-channel MOSFET $M_8$, forming a current minor. MOSFET $M_8$ preferably has a gate width equal to one half of the gate-width of MOSFET $M_3$, resulting in a current equal to one half of the value of current source $I_1$ being sourced from the drain of $M_8$. The current flows through diode-connected P-channel MOSFET $M_{14}$, since N-channel MOSFET $M_7$ is turned OFF. The fact that MOSFET $M_7$ is turned OFF also ensures that diode-connected P-channel MOSFET $M_{17}$ conducts substantially no current. Under these conditions, MOSFETs $M_{12}$ and $M_{14}$ will each be operating with a source-drain current equal to one half the value of current source $I_1$. Since MOSFETs $M_{12}$ and $M_{14}$ are, under these conditions, operating at substantially the same current, their gate-source voltages will be substantially the same. Therefore, the voltage at terminal $V_{CONN}$ will be substantially equal to the voltage at the source of MOSFET $M_9$ or $V_{ONN}$ which, as described above, is the preferred ON voltage for the N-channel MOSFET portion of a single CMOS switch in a programmable-gain amplifier.

N-channel MOSFET $M_{13}$, along with current source $I_4$, forms a second source-follower buffer for voltage $V_{SD1}$. N-channel MOSFET $M_{16}$, along with current source $I_5$, forms a source-follower buffer for CMOS switch signal voltage $V_{SD2}$. MOSFETs $M_{13}$ and $M_{16}$ are preferably of the minimum geometry allowed by the process design rules and voltage requirements in order to minimize the capacitive loading on the voltage $V_{SD1}$ and $V_{SD2}$, respectively. Current sources $I_4$ and $I_5$ are preferably substantially the same value, each equal to 10 µA in one illustrative embodiment. The voltages at the sources of MOSFETs $M_{13}$ and $M_{16}$ will be substantially $V_{S13}=V_{SD1}-V_{GS13}$ and $V_{S16}=V_{SD2}-V_{GS16}$, respectively, where $V_{GS13}$ and $V_{GS16}$ are the gate-source voltages of MOSFETs $M_{13}$ and $M_{16}$, respectively. Since MOSFETs $M_{13}$ and $M_{16}$ operate at the same current, their gate-source voltages will be substantially equal.

P-channel MOSFETs $M_{15}$ and $M_{18}$, along with current source $I_6$ form a "less-than or equal-to" circuit. $M_{15}$ and $M_{18}$ are preferably identical-geometry devices. If the voltage $V_{S13}$ is substantially less than the voltage $V_{S16}$, then substantially all of the current from current source $I_6$ will be conducted by MOSFET $M_{15}$, and the voltage $V_{S15}$ at the junction of the sources of MOSFETs $M_{15}$ and $M_{18}$ will be: $V_{S15}=V_{SD1}-V_{GS13}+V_{SG15}$, where $V_{SG15}$ is the source-gate voltage of $M_{15}$. If the voltage $V_{S16}$ is substantially less than the voltage $V_{S13}$, then substantially all of the current from current source $I_6$ will be conducted by MOSFET $M_{18}$, and the voltage at the junction of the sources of MOSFETs $M_{15}$ and $M_{18}$ will be: $V_{S15}=V_{SD2}-V_{GS16}+V_{SG18}$, where $V_{SG18}$ is the source-gate voltage of MOSFET $M_{18}$. Noting that the gate-source voltages of N-channel and P-channel MOSFETs are of opposite polarities, the voltage $V_{S15}$ will be the lesser of $V_{SD1}$ or $V_{SD2}$, plus an offset voltage equal to the difference between the magnitudes of the gate-source voltages of one N-channel MOSFET and one P-channel MOSFET. While it should be clear that it is possible to ensure that this offset voltage is approximately zero, this can only be done approximately, since the threshold voltages of N-channel and P-channel devices are subject to independent process variations. However, this level of accuracy is sufficient in most instances, as will be shown below.

When control voltage $V_{CONTROL}$ is low, the current from current source $I_1$ is steered via MOSFETs $M_2$ to $M_4$. Further, since there is substantially no current flowing in MOSFET $M_3$, there is also substantially no current flowing in MOSFET $M_8$, and MOSFET $M_{14}$ is turned OFF. The gate and source terminals of MOSFET $M_4$ are connected to the gate and source terminals, respectively, of P-channel MOSFET $M_5$, forming a current mirror. MOSFET $M_5$ preferably has a gate width equal to one half of the gate-width of MOSFET $M_4$, resulting in a current equal to one half of the value of current source $I_1$ being sourced from the drain of MOSFET $M_5$. The current flows through diode-connected MOSFET $M_6$ and is mirrored to MOSFET $M_7$. Thus, a current equal to one half of the value of current source $I_1$ is sunk by MOSFET $M_7$, which flows through diode-connected MOSFET $M_{17}$. In one implementation the value of the current provided by current source $I_6$ is equal to the value of $I_1$. Thus, half of the current from source $I_6$ flows through MOSFET $M_{17}$, while the balance is available for either MOSFETs $M_{15}$ or $M_{18}$, or both, depending on the relative levels of the voltage $V_{SD1}$ and $V_{SD2}$ provided respectively at the terminals $S_{D1}$ and $S_{D2}$. The voltage at terminal $V_{CONN}$ under these conditions will be substantially equal to the lesser of $V_{SD1}$ or $V_{SD2}$ plus the aforementioned offset dependent on the difference between N-channel and P-channel gate-source voltages, minus the gate-source voltage of $M_{17}$. The magnitude of the gate-source voltage of $M_{17}$ is always sufficient to ensure that the voltage at $V_{CONN}$ will be slightly below the lesser of voltages $V_{SD1}$ or $V_{SD2}$, which, as described above, is one implementation of the OFF-voltage for the N-channel MOSFET portion of a single CMOS switch in a programmable-gain amplifier according to the present invention.

FIG. 10 schematically illustrates additional circuitry to create a gate drive signal for the P-channel MOSFET in the CMOS switch to be controlled. The terminals labeled $V_{MON}$ and $V_{MOFF}$ are intended to be connected to the identically named terminals in FIG. 9. Thus, the gate and drain terminals of MOSFETs $M_3$ and $M_4$ in FIG. 9 are connected to the gate terminals of P-channel MOSFETs $M_{19}$ and $M_{22}$ in FIG. 10, respectively. The terminals labeled $V_{SD1}$ and $V_{SD2}$ in FIG. 10 connect to the identically named terminals in FIG. 9, as well as to the signal terminals $SD_1$ and $SD_2$ of the CMOS switch to be controlled as illustrated in FIG. 3. In one implementation, terminal $V_{CONP}$ is connected to the gate terminal of the P-channel MOSFET in the CMOS switch to be controlled.

N-channel MOSFET $M_{23}$, along with diode-connected P-channel MOSFET $M_{24}$, diode-connected N-channel MOSFET $M_{25}$, and current source $I_7$ in FIG. 10 form a third source-follower buffer for source-drain voltage $V_{SD1}$, such that the voltage $V_{ONP}$ at the source of $M_{25}$ is substantially given by: $V_{ONP}=V_{SD1}-V_{GS24}-V_{SG24}-V_{GS25}$, where $V_{GS23}$, $V_{SG24}$, and $V_{GS25}$ are the gate-source (or source-gate) voltages of $M_{23}$, $M_{34}$, and $M_{25}$, respectively, and all are positive quantities. These gate-source voltages are substantially constant with changes in source-drain voltage $V_{SD1}$ to the extent that current source $I_7$ is constant, since the gate of N-channel MOSFET $M_{27}$ provides negligible loading on the source of MOSFET $M_{25}$. MOSFET $M_{23}$ is preferably of the minimum geometry allowed by the process design rules and voltage requirements in order to minimize the capacitive loading on the voltage $V_{SD1}$. In an example of one embodiment, the value of current provided by current source $I_7$ is approximately 10 μA, and the nominal value of the sum of gate-source voltages of MOSFETs $M_{23}$ though $M_{25}$ is 9V. Thus, the voltage $V_{ONP}$ at the source of MOSFET $M_{25}$ will substantially equal the preferred ON-voltage for the N-channel MOSFET in the CMOS switch to be controlled, as described above.

P-channel MOSFET $M_{27}$ and current source $I_8$ act as a source-follower buffer for voltage $V_{ONP}$ such that the voltage at the source of MOSFET $M_{27}$ is substantially equal to $V_{ONP}$+$V_{SG27}$, where voltage $V_{SG27}$ is the source-gate voltage of MOSFET $M_{27}$. The preferred value for current source $I_8$ is equal to the value of current provided by current source $I_1$ in FIG. 9. Referring to FIG. 9, when control voltage $V_{CONTROL}$ is high, the current from current source $I_1$ is steered via MOSFETs $M_1$ to $M_3$, and there will be substantially no current flowing in MOSFET $M_4$. Since the gates and drains of MOSFET $M_4$ (FIG. 8) and MOSFET $M_{22}$ (FIG. 9) are connected together, there will be substantially no current flowing in P-channel MOSFET $M_{22}$. Similarly, the gate and source terminals of MOSFET $M_3$ (FIG. 8) are connected to the gate and source terminals, respectively, of P-channel MOSFET $M_{19}$ (FIG. 9), forming a current mirror. MOSFET $M_{19}$ preferably has a gate width equal to one half of the gate-width of MOSFET $M_3$, resulting in a current equal to one half of the value of current provided by current source $I_1$ being sourced from the drain of MOSFET $M_{19}$. Referring to FIG. 10, the current flows through diode-connected N-channel MOSFET $M_{20}$, which forms a current minor with N-channel MOSFET $M_{21}$. Therefore the drain current of MOSFET $M_{21}$ will be substantially equal to one half of the drain current of current source $I_1$ in FIG. 9. The drain current will flow through diode-connected P-channel MOSFET $M_{28}$, since (as noted above) MOSFET $M_{22}$ is turned OFF. The fact that MOSFET $M_{22}$ is turned OFF also ensures that diode-connected N-channel MOSFET $M_{32}$ conducts substantially no current. Under these conditions, MOSFET $M_{27}$ and $M_{28}$ will each be operating with a source-drain current equal to one half the value of current provided by current source $I_1$. Since MOSFETs $M_{27}$ and $M_{28}$ are, under these conditions, operating at substantially the same current level, their gate-source voltages will be substantially the same. Therefore, the voltage at terminal $V_{CONP}$ will be substantially equal to the voltage at the source of MOSFET $M_{25}$ (or $V_{ONP}$) which, as described above, is the preferred ON-voltage for the P-channel MOSFET portion of a single CMOS switch in a programmable-gain amplifier.

P-channel MOSFET $M_{26}$, along with current source $I_9$, forms a fourth source-follower buffer for voltage $V_{SD1}$. N-channel MOSFET $M_{30}$, along with current source $I_{10}$, forms a second source-follower buffer for CMOS switch signal voltage $V_{SD2}$. MOSFETs $M_{26}$ and $M_{30}$ are preferably of the minimum geometry allowed by the process design rules and voltage requirements in order to minimize the capacitive loading on the voltages $V_{SD1}$ and $V_{SD2}$, respectively. Current sources $I_9$ and $I_{10}$ are preferably substantially the same value, each equal to 10 μA in one example of an embodiment. The voltages at the sources of MOSFETs $M_{26}$ and $M_{30}$ will be substantially $V_{S26}=V_{SD1}+V_{SG26}$ and $V_{S30}=V_{SD2}-V_{SG30}$, respectively, where voltages $V_{SG26}$ and $V_{SG30}$ are the source-gate voltages of MOSFETs $M_{26}$ and $M_{30}$, respectively. Since MOSFETs $M_{26}$ and $M_{30}$ operate at the same current level, their source-gate voltages will be substantially equal. N-channel MOSFETs $M_{29}$ and $M_{31}$, along with current source $I_{11}$, form a "greater-than or equal-to" circuit. MOSFET $M_{29}$ and $M_{31}$ are preferably identical-geometry devices. If the voltage $V_{S26}$ is substantially greater than the voltage $V_{S30}$, then substantially all of the current from $I_{11}$ will be conducted by $M_{29}$, and the voltage $V_{S29}$ at the junction of the sources of MOSFETs $M_{29}$ and $M_{31}$ will be: $V_{S29}=V_{SD1}+V_{SG26}-V_{GS29}$. If the voltage $V_{S30}$ is substantially greater than the voltage $V_{S26}$, then substantially all of the current from current source $I_{11}$ will be conducted by MOSFET $M_{31}$, and the voltage at the junction of the sources of MOSFETs $M_{29}$ and $M_{31}$ will be: $V_{S29}=V_{SD2}+V_{SG30}-V_{GS31}$. Noting that the gate-source voltages of N-channel and P-channel MOSFETs are of opposite polarities, the voltage $V_{S29}$ will be the greater of either voltage $V_{SD1}$ or $V_{SD2}$, plus an offset voltage equal to the difference between the magnitudes of the gate-source voltages of one N-channel MOSFET and one P-channel MOSFET.

Referring to FIG. 9, when control voltage $V_{CONTROL}$ is low, the current from current source $I_1$ is steered via MOSFET $M_2$ to $M_4$. Further, since there is substantially no current flowing in MOSFET $M_3$, there is also substantially no current flowing in MOSFET $M_{19}$ in FIG. 10. Therefore MOSFETs $M_{20}$, $M_{21}$, and $M_{28}$ in FIG. 10 are also turned OFF. The gate and source terminals of MOSFET $M_4$ are connected to the gate and source terminals, respectively, of P-channel MOSFET $M_{22}$ in FIG. 10, forming a current minor. MOSFET $M_{22}$ preferably has a gate width equal to one half of the gate-width of MOSFET $M_4$, resulting in a current equal to one half of the value of current source $I_1$ being sourced from the drain of MOSFET $M_{22}$, which flows through diode-connected MOSFET $M_{32}$. The value of current source $I_{11}$ is preferably equal to the value of the current provided by current source $I_1$. Thus, half of the current from current source $I_{11}$ flows through MOSFET $M_{32}$, while the balance is available for either MOSFETs $M_{29}$ or $M_{31}$, or both, depending on the relative levels of the voltages $V_{SD1}$ and $V_{SD2}$. The voltage at terminal $V_{CONP}$ under these conditions will be substantially equal to the greater of the two voltages $V_{SD1}$ and $V_{SD2}$, plus the aforementioned offset dependent on the difference between N-channel and P-channel gate-source voltages, plus the gate-source voltage of MOSFET $M_{32}$. The magnitude of the gate-source voltage of MOSFET $M_{32}$ is always sufficient to ensure that the voltage $V_{CONP}$ will be slightly above the greater of the voltages $V_{SD1}$ and $V_{SD2}$, which, as described above, is the preferred OFF voltage for the P-channel MOSFET portion of a single CMOS switch in a programmable-gain amplifier according to the present invention.

An additional advantage of this architecture is the ability to control the turn-on and turn-off times of the CMOS switches in the programmable-gain amplifier. In audio applications in particular, fast voltage transitions on the gates of the MOSFETs making up the switches can be capacitively coupled to the channels via the gate-to-channel capacitance, resulting in audible "clicks" during gain transitions. This phenomenon, sometimes referred to as "charge injection," can be minimized by choosing geometries for the N-channel and P-channel devices that make up the switch that result in matched gate-channel capacitances between the N-channel and P-channel devices. (In this approach, the gate of each device is driven from an opposite-moving signal, so that the two signals inject equal and opposite charge into the signal path, which theoretically cancel each other out.) However, this approach is almost never completely successful in eliminating audible clicks when the gates are driven with very fast rise times. Thus, providing a voltage ramp with a predetermined rate of change between the ON-voltage and OFF-voltage to the gates of the MOSFETs in the switch is a desirable characteristic for the gate drive circuitry of a programmable gain amplifier for audio applications.

Referring to FIG. 9, when a fast low-to-high transition in the voltage $V_{CONTROL}$ is applied to the $V_{CONTROL}$ terminal, (a) the current from current source $I_1$ is steered from MOSFETs $M_4$ to $M_3$, (b) MOSFET $M_{17}$ is turned OFF, and (c) MOSFET $M_8$ is turned ON. This current steering occurs very quickly as all of the relevant nodes are relatively low-impedance. However, when MOSFET $M_8$ turns ON, its drain current will not immediately flow through MOSFET $M_{14}$, but must first charge any load capacitance connected to the $V_{CONN}$ terminal. Preferably, the primary load capacitance on this node is the gate-to-channel capacitance of the N-channel device in the CMOS switch. This can be quite significant, as the geometries required for the low-on resistance switches needed in a low-noise programmable-gain amplifier are very large compared with the geometries of the devices in the gate drive circuitry. By scaling the value of current source $I_1$, and with it the values of current sources $I_3$ and $I_6$ in proportion, the rate of change between the OFF and ON-states of the N-channel device in the switch can be controlled.

Similarly, when a fast high-to-low transition in $V_{CONTROL}$ is applied, MOSFET $M_8$ turns OFF and MOSFET $M_7$ turns on very quickly. The current sunk by MOSFET $M_7$ charges the load capacitance (not shown) on the $V_{CONN}$ terminal, providing a controlled ramp between the ON and OFF-states of the switch. It should be clear to those skilled in the art that the drive circuitry for the P-channel MOSFET in the switch, shown in FIG. 10, will behave in a similar fashion as that for the N-channel MOSFET.

In a preferred embodiment, the geometries of the CMOS switches are scaled in size to suit the requirements for noise and distortion performance required of the analog gain amplifier at its various programmable gains. Typically, gain-control switches $S_1$ through $S_N$ shown in FIG. 2 would be scaled such that the switches that activate the highest gain setting would have the lowest ON-resistance, and thus be the widest switches. For instance, in FIG. 2, gain control switch $S_N$ would be the widest and switch $S_1$ would be the narrowest. Gain-control switches $SF_1$ through $SF_M$ would preferably be scaled such that the ON-resistance of each would be chosen to have negligible compared to its associated series resistor $R_{F1}$ through $R_{FM}$. Once these geometries are chosen, the values of $I_1$, $I_3$, $I_6$, $I_8$, and $I_{11}$ of the corresponding current sources may be chosen for each of the individual gate drive circuits to provide the same ramp rate for gate voltage transitions for all switches. Larger switches, which have larger capacitance, would have larger values for currents $I_1$, $I_3$, $I_6$, $I_8$ and $I_{11}$, while smaller switches, which have smaller capacitances, would have smaller values for currents $I_1$, $I_3$, $I_6$, $I_8$, and $I_{11}$. In one example, these currents ranged from 1 μA to 16 μA to achieve an approximately 20 μsec transition time between ON and OFF-states for all switches.

Alternatively to scaling the value of $I_1$ and other currents proportionately for each geometry of switch, the values of current $I_1$ and its proportionate other currents could be constant for all drive circuits, and the ratio of the widths of MOSFET $M_3$ to $M_8$, as well as MOSFETs $M_{19}$, $M_{20}$, and $M_{21}$, and $M_4$ to $M_5$, $M_6$, $M_7$, and $M_{22}$, could be scaled inversely to the width of the devices in the associated switch to achieve similar results. Further, scaling the ratio of the width of MOSFETs $M_7$ to $M_8$ and MOSFETs $M_{21}$ to $M_{22}$ can be done if different rates of change of gate drive voltage for ON-to-OFF and OFF-to-ON transitions are desired.

It should be clear that the general approach described herein can be applied to other programmable-gain amplifier and/or switching topologies. In particular, the switch driver described may be applied to the programmable-gain instrumentation amplifier shown in FIG. 4 of the Copending Application. It may also be employed for other programmable-gain amplifier topologies, and for simple switching topologies, where low distortion, low noise, and high-voltage capability are desired. Further, changes in the types of semiconductor devices employed may be made.

It should be noted that although the MOSFETs $M_A$ and $M_B$ of the switch shown in FIG. 3 is described as having a source and drain, it should be appreciated that in the context that these devices are being used (as switches with time varying signals applied), which terminal of each MOSFET is the source and which is the drain switches as the signal changes polarity. In one embodiment the MOSFETs are physically symmetrical devices, and the bias conditions distinguish and therefore determine which terminal is functioning as the source and which is functioning as the drain. For N-channel devices, the terminal that is at the lower potential (with respect to the gate) is the source and the terminal with the higher potential is the drain. The opposite is true for the P-channel device. So the gate drive circuit maintains the proper "gate-source voltage" with respect to the correct terminal. In the implementation of FIG. 8, the gate drive circuit maintains the proper "gate-source voltage" as a function of the outputs of the "less-than-or-equal-to" $Block_1$ and the "greater-than-or-equal-to" $Block_2$ of the SDC. Accordingly, it should be understood that each MOSFET is described as including two source-drain terminals because each terminal is capable of operating as either depending on how the MOSFET is biased.

Thus, a new and improved dynamic switch driver for a low-distortion programmable-gain amplifier such as the type described in the Copending Application is provided in accordance with the present disclosure. The exemplary embodiments described in this specification have been presented by way of illustration rather than limitation, and various modifications, combinations and substitutions may be effected by those skilled in the art without departure either in spirit or scope from this disclosure in its broader aspects and as set forth in the appended claims.

The new and improved dynamic switch driver for a low-distortion programmable-gain amplifier of the type described in the Copending Application and method of the present disclosure as disclosed herein, and all elements thereof, are contained within the scope of at least one of the following claims. No elements of the presently disclosed system and method are meant to be disclaimed, nor are they intended to necessarily restrict the interpretation of the claims. In these claims, reference to an element in the singular is not intended to mean "one and only one" unless specifically so stated, but rather "one or more." All structural and functional equivalents to the elements of the various embodiments described throughout this disclosure that are known or later come to be known to those of ordinary skill in the art are expressly incorporated herein by reference, and are intended to be encompassed by the claims. Moreover, nothing disclosed herein is intended to be dedicated to the public, regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A switching circuit for switching a time-varying input signal, the switching circuit comprising:
    at least one switch including a N-channel MOSFET and a P-channel MOSFET, each having a gate configured to receive a drive signal to change the ON/OFF state of the switch; and
    a drive circuit configured and arranged so as to selectively apply a pair of drive signals to change the ON/OFF state of the switch, the drive circuit being configured and arranged to generate the drive signals as a function of (a) a pair DC signal components sufficient to change the ON/OFF state of the switch and (b) a pair of time-varying signal components as at least a partial replica of the signal present on the source terminal of each MOSFET so that when applied with the DC signals to the gates of the n-channel MOSFET and p-channel MOSFET respectively, the drive signals will be at the appropriate level to maintain the ON/OFF state of the switch and keep the gate-source voltages of each MOSFET within the gate-source breakdown limit of the MOSFETs;
    wherein the n-channel MOSFET and p-channel MOSFET each include two source-drain terminals, and the drive circuit is configured and arranged so that when the switch is in the OFF-state, the voltage applied to the gate of the n-channel MOSFET is equal to or more negative than the voltage applied to the most negative source-drain of the n-channel MOSFET, and the voltage applied to the gate of the p-channel MOSFET is more positive than the voltage applied to the most positive source-drain of the p-channel MOSFET.

2. A switching circuit according to claim 1, wherein the MOSFETs are configured so that one source-drain of one MOSFET is coupled to one source-drain of the other MOSFET to form a first coupled pair of MOSFET source-drain terminals, and the remaining source-drain terminals of the MOSFETs are coupled to each other to form a second coupled pair of MOSFET source-drain terminals.

3. A switching circuit for switching a time-varying input signal, the switching circuit comprising:
    at least one switch including a N-channel MOSFET and a P-channel MOSFET, each having a gate configured to receive a drive signal to change the ON/OFF state of the switch; and
    a drive circuit configured and arranged so as to selectively apply a pair of drive signals to change the ON/OFF state of the switch, the drive circuit being configured and arranged to generate the drive signals as a function of (a) a pair DC signal components sufficient to change the ON/OFF state of the switch and (b) a pair of time-varying signal components as at least a partial replica of the signal present on the source terminal of each MOSFET so that when applied with the DC signals to the gates of the n-channel MOSFET and p-channel MOSFET respectively, the drive signals will be at the appropriate level to maintain the ON/OFF state of the switch and keep the gate-source voltages of each MOSFET within the gate-source breakdown limit of the MOSFETs;
    wherein the n-channel MOSFET and p-channel MOSFET each include two source-drain terminals, and the drive circuit is configured and arranged so that when the switch is in the ON-state, the voltage applied to the gate of the n-channel MOSFET is sufficiently positive with respect to that of its source-drain terminals so that the n-channel MOSFET provides a desired on resistance, and the gate-source voltage applied to the gate of the p-channel MOSFET is sufficiently negative with respect to that of its source-drain terminals so that the p-channel MOSFET provides a desired on-resistance so that the two MOSFETs conduct.

4. A switching circuit according to claim 3, wherein the gate-source voltage applied to the gate of the n-channel MOSFET is more positive than the voltage at the source and drain of the n-channel MOSFET when the switch is in the ON-state, and the gate-source voltage applied to the gate of the p-channel MOSFET is more negative than the voltage at the source and drain of the p-channel MOSFET when the switch is in the ON-state.

5. A switching circuit for switching a time-varying input signal, the switching circuit comprising:
    at least one switch including a N-channel MOSFET and a P-channel MOSFET, each having a gate configured to receive a drive signal to change the ON/OFF state of the switch; and
    a drive circuit configured and arranged so as to selectively apply a pair of drive signals to change the ON/OFF state of the switch, the drive circuit being configured and arranged to generate the drive signals as a function of (a) a pair DC signal components sufficient to change the ON/OFF state of the switch and (b) a pair of time-varying signal components as at least a partial replica of the signal present on the source terminal of each MOSFET so that when applied with the DC signals to the gates of the n-channel MOSFET and p-channel MOSFET respectively, the drive signals will be at the appropriate level to maintain the ON/OFF state of the switch and keep the gate-source voltages of each MOSFET within the gate-source breakdown limit of the MOSFETs;

further comprising first and second electronically-controlled selectors, each selector having first and second input terminals and one output terminal and one control terminal, wherein the control terminal is configured to receive a control signal that determines whether the first input terminal or the second input terminal is electrically coupled to the output terminal, and wherein the control terminals on the two selectors are coupled to one another.

6. A switching circuit according to claim 5, further including (a) a first buffer amplifier, (b) a first offset voltage generator having a negative terminal coupled to the output of the first buffer amplifier, the first offset voltage generator including a positive terminal coupled to the first input terminal of the first electronically controlled selector, and (c) a second offset voltage generator having a positive terminal coupled to the output terminal of the first buffer amplifier, and a negative terminal coupled to the first input terminal of the second electronically controlled selector.

7. A switching circuit according to claim 6, further including a less-than-or-equal-to circuit including a first input terminal for receiving a first input signal, and second input terminal for receiving a second input signal, and an output terminal for producing an output signal proportional to the more negative of the two input signals.

8. A switching circuit according to claim 7, further including a greater-than-or-equal-to circuit including a first input terminal for receiving a first input signal, and second input terminal for receiving a second input signal, an output terminal for producing an output signal proportional to the more positive of the two input signals.

9. A switching circuit according to claim 8, wherein the output terminal of the first buffer amplifier is coupled to the first input terminal of the less-than-or-equal-to circuit and to the first input terminal of the greater-than-or equal-to circuit, the output terminal of the second buffer amplifier is coupled to the second input terminal of the less-than-or-equal-to circuit and to the second input terminal of the greater-than-or equal-to circuit, the output terminal of the less-than-or-equal-to circuit is coupled to the second input terminal of the first electronically controlled selector, and the output terminal of the greater-than-or-equal-to circuit is coupled to the second input terminal of the second electronically controlled selector, wherein when the control signal applied to the two selectors is in one state, the offset voltage produced by the first offset voltage generator added to the output signal from the first buffer amplifier is coupled to the gate of the N-channel MOSFET of the switch and the offset voltage produced by the second offset voltage generator subtracted from the output signal from the first buffer amplifier is coupled to the gate of the P-channel MOSFET of the switch and when the control signal applied to the two selectors is in the a second state, the more negative of the outputs of the two buffer amplifiers is coupled to the gate of the N-channel MOSFET and the more positive of the outputs from the two buffer amplifiers is coupled to the P-channel MOSFET of the switch.

* * * * *